United States Patent
Ma et al.

[11] Patent Number: 5,952,269
[45] Date of Patent: Sep. 14, 1999

[54] FORMATION OF SUPERCONDUCTING DEVICES USING A SELECTIVE ETCHING TECHNIQUE

[75] Inventors: Qiyuan Ma, New York, N.Y.; Mingling Chen, Cambridge, Mass.

[73] Assignee: The Trustees of Columbia University in the City of New York, New York, N.Y.

[21] Appl. No.: 09/012,348

[22] Filed: Jan. 23, 1998

Related U.S. Application Data

[60] Provisional application No. 60/037,078, Feb. 3, 1997.

[51] Int. Cl.⁶ .................................................. H01L 39/24
[52] U.S. Cl. .......................... 505/325; 505/410; 505/413; 505/728; 505/210; 505/211
[58] Field of Search ..................... 505/325, 410, 505/413, 728, 210, 211; 427/62, 63

[56] References Cited

U.S. PATENT DOCUMENTS

| | | |
|---|---|---|
| 4,093,503 | 6/1978 | Harris . |
| 4,446,431 | 5/1984 | McKay . |
| 4,916,116 | 4/1990 | Yamazaki ..................................... 505/1 |
| 4,926,289 | 5/1990 | Reichert . |
| 5,034,374 | 7/1991 | Awaji et al. ................................ 505/1 |
| 5,189,386 | 2/1993 | Tada et al. . |
| 5,227,364 | 7/1993 | Fujiwara et al. ......................... 505/325 |
| 5,276,398 | 1/1994 | Withers et al. . |
| 5,280,248 | 1/1994 | Zou et al. . |
| 5,351,007 | 9/1994 | Withers et al. . |
| 5,512,540 | 4/1996 | Yamazaki ................................. 427/62 |
| 5,547,922 | 8/1996 | Ma . |
| 5,646,096 | 7/1997 | Inada et al. ............................. 505/430 |

FOREIGN PATENT DOCUMENTS

| | | |
|---|---|---|
| 64-7430 | 1/1989 | Japan . |
| 1-054775 | 3/1989 | Japan . |
| 2-84732 | 3/1990 | Japan . |

OTHER PUBLICATIONS

Ma et al, Appl. Phys. lett. 65(2) Jul. 1994, pp. 240–242.
Shih et al, Appl. Phys. lett. 52(18) May 1988 pp. 1523–1524.
Eidelloth et al, Appl. Phys. lett. 59(10), Sep. 1991, pp. 1257–1259.
Ma et al., "Inhibition patterning of oxide superconducting films with Si ion implantation," *Superconducting Science Technology*, vol. 7, pp. 294–297, 1994. No month data!
Withers et al., "Thin–Film HTS Probe Coils for Magnetic–esonance Imaging," *IEEE Transactions on Applied Superconductivity*, vol. 3, No. 1, pp. 2450–2453, Mar. 1993.
Penn et al., "Design of RF Receiver Coils Fabricated from High Temperature Superconductor for Use in Whole Body Imaging Equipment," *World Congress of Superconductivity*, vol. 1, Nos. 10–12, pp. 1855–1861, 1993. No month data!
Hill, "A High–Sensitivity NMR Spectroscope Probe Using Superconductive Coils," *Magnetic Moments*, vol. 8, No. 1, pp. 1, 4–6, 1996. No month data!

*Primary Examiner*—Roy V. King
*Attorney, Agent, or Firm*—Baker & Botts, L.L.P.

[57] ABSTRACT

A method for forming a superconducting device using a selective etching technique on superconducting thin films. The method utilizes rapid etching which combines ion implantation with chemical etching. The portions of the superconducting film to be retained are masked from the ion implantation process. The chemical etching process then removes the implanted portions of the superconducting film at a much faster rate than the portions not implanted so that only the un-implanted portions remain. The resulting superconducting devices can be used, e.g., as nanostructures and nano tips, bolometers, multilayer RF coils, microwave waveguides and filters.

13 Claims, 8 Drawing Sheets

| CONCENTRATION (M) | ETCHING RATE OF YBCO (A/S) | | | | ETCHING RATE OF TBCCO (A/S) | |
|---|---|---|---|---|---|---|
| | PURE | IMPLANTED | | | PURE | IMPLANTED |
| | | $Al^{3+}$ 200keV | $Al^{3+}$ 120keV | $Fe^{3+}$ 100keV | | |
| $1.5 \times 10^{-3}$ | 0 | 75 | | | | |
| $6.0 \times 10^{-2}$ | 80 | 82 | | | | |
| $7.0 \times 10^{-2}$ | 80 | 400 | | | 0 | |
| $1.0 \times 10^{-1}$ | | 1300 | 86 | 70 | | |
| $2.0 \times 10^{-1}$ | 500 | | 100 | 85 | 5 | 340 |
| $3.0 \times 10^{-1}$ | 650 | 800 | 500 | 265 | | |
| $5.0 \times 10^{-1}$ | 800 | | 750 | 420 | 7 | |
| $1.0 \times 10^{-0}$ | 1200 | | 1000 | 700 | 30 | |
| $2.0 \times 10^{-0}$ | | | | | | |
| $3.0 \times 10^{-0}$ | 200 | 250 | | | 95 | 200 |

FIG. 5

FORMATION OF SUPERCONDUCTING DEVICES USING A SELECTIVE ETCHING TECHNIQUE

This application claims priority to the U.S. provisional application No. 60/037,078, filed Jan. 3, 1997 by Ma and Chen entitled "Formation of Superconducting Devices Using a Selective Etching Technique".

The U.S. Government has certain rights in this invention pursuant to awards 9521208 and 9625137 by the National Science Foundation.

TECHNICAL FIELD

This application relates to a method for selectively etching portions of superconducting materials to produce a superconducting device with a desired configuration. The inventive method uses ion implantation in conjunction with chemical etching to produce microscopic superconducting devices.

BACKGROUND OF THE INVENTION

Recent progress in high temperature superconducting (HTS) electronics has demonstrated that HTS materials can provide faster, quieter and more precise electronics for the 21st century. A HTS device could switch much faster and require much less power than a silicon transistor, have several orders of magnitude lower microwave loss than that of a metal at satellite operating frequencies (10–60 GHz) and even detect human brain signals with the highest sensitivity. The HTS devices currently under development include Josephson junctions, superconducting quantum interference devices (SQUIDs), radio frequency (RF) coils, bolometers, and microwave components. The Josephson junctions are the building blocks of superconducting digital circuits for ultra-fast computers and communication systems. The SQUID has a variety of applications, including magnetic, non-invasive diagnosis for the human heart and brain, non-destructive evaluation for many structural materials, and geophysical exploration. The RF coils made of HTS have shown a great improvement in signal-to-noise ratio or image resolution in MRI (magnetic resonance imaging) systems. A HTS bolometer built on silicon membrane is very sensitive in order to detect radiation and small changes in temperature. Prototypes of HTS microwave devices have a superior performance in both space and cellular communications.

The full realization of these HTS devices depends on the development of reliable processing technology. Due to the fact that HTS materials are oxides (e.g., YBaCUO and TIBaCaCuO), they are very sensitive to the environment such as moisture, chemicals, and water. The surface reaction usually decomposes the surface layer of the materials and degrades the performance of the devices. As a result, the yield of the HTS devices by conventional etching methods is very poor, e.g., only 15–20%.

Chemical etching is one possible way to configure a desired design in a superconducting thin film. However, the strong thermodynamic driving force necessary in the etching process due to the formation of hydroxides and carbonates degrade the HTS materials significantly. Previous etching methods that had been developed have a typical duration of about 3–16 minutes in contact with the etching agent assuming a 3000 Å thick film. This long etching time causes an increased surface resistance of the films and loss of its superconducting properties due to the increased chemical reaction. A rapid etching process is therefore required to reduce the possibility of degradation of the superconductivity at the surface of the films. The etching process must remove the unwanted portions of the film while retaining the selected portions in a short period of time.

Ion implantation has been widely used for doping semiconductor devices. Recently, ion implantation has also been applied for inhibiting superconductivity in HTS films and for patterning HTS planar devices (See Ma et al, "A Planar Method for Patterning HTS Films and Multilayers" *Appl. Phys. Lett.,* Vol 65, p. 240, 19941. In this process, a portion of a HTS film in inhibited with reactive ion implantation and the portion converts into non-superconducting material. The uninhibited portion remains superconducting as the device region, surrounded by the inhibited region. Thus, the applications for this type of device is limited to a fully layered structure.

SUMMARY OF THE INVENTION

The invention provides a method for forming a designed thin film superconducting device using a selective etching technique. The technique allows for the selective patterning of superconducting thin films either as a single layer or as a multi-layered device. The inventive method forms a superconducting layer on top of a substrate material. A mask is then applied to cover selected portions of the superconducting layer and ions are implanted into the layer. Next, a chemical etching technique such as an acid bath is applied to remove the portions of the superconducting layer which were not masked and ion implanted. The resulting device can be configured to be used, e.g., as HTS nanostructures such as carry confined devices, Josephson junctions, SQUIDs, RF coils, bolometers, microwave waveguides and filters. The process enables microscopic superconducting devices to be produced.

The selective chemical etching processes can be modified by altering the chemical etching solvent and by altering the type of ion implantation (both ion type and energy level). The ion implanted superconducting thin films will be removed during the chemical etching process at a much higher rate than the non-implanted regions. A thicker superconducting film or a superconducting bulk wafer can also be used in place of the substrate if required.

BRIEF DESCRIPTION OF THE DRAWINGS

Further objects, features and advantages of the invention will become apparent from the following detailed description taken in conjunction with the accompanying drawings showing the preferred embodiments of the invention, in which:

FIG. 5 shows a table comparing etching rates between pure and ion implanted HTS structures;

DESCRIPTION OF A PREFERRED EMBODIMENT

The present invention forms superconducting devices using a selective etching technique. Superconducting thin films are formed on substrates and can be patterned to a desired configuration. The substrate could be an IC chip wafer or made from conventional oxide materials, such as $SrTiO_3$, $LaAlO_3$, $Al_2O_3$, or MgO. The use of an ion implantation device set to the proper energy level in conjunction with the use of a mask or masks covering selected portions of the superconducting layer allows for the removal of the ion implanted portions of the layer during the chemical etching process at a much higher rate than the region not implanted. If the concentration level of the chemical etching agent (typically an acid) is low enough, the un-implanted regions will not be dissolved at all. However, all of the ion implanted regions will be dissolved. Therefore, only the selected regions of the superconducting thin film covered by the masks will remain. The etching process is greatly speeded up due to the ion implantation and this reduces any degradation in the remaining superconducting portions.

The preciseness and microscopic size of the ion beam from the ion implantation device allows for fine patterns to be produced in the superconductor film. The inventive process can produce superconducting devices even on the nanometer order of size. Some examples of the superconducting devices which can be produced are a Josephine junction, bolometer, RF coil, and a waveguide. These tiny devices and other designs can be used in an ultra-miniature chip, sensor or electronic component design. One example of a use for such a small device is as the tip for a scanning tunneling microscope which detects objects as small as atoms.

Figure 1:
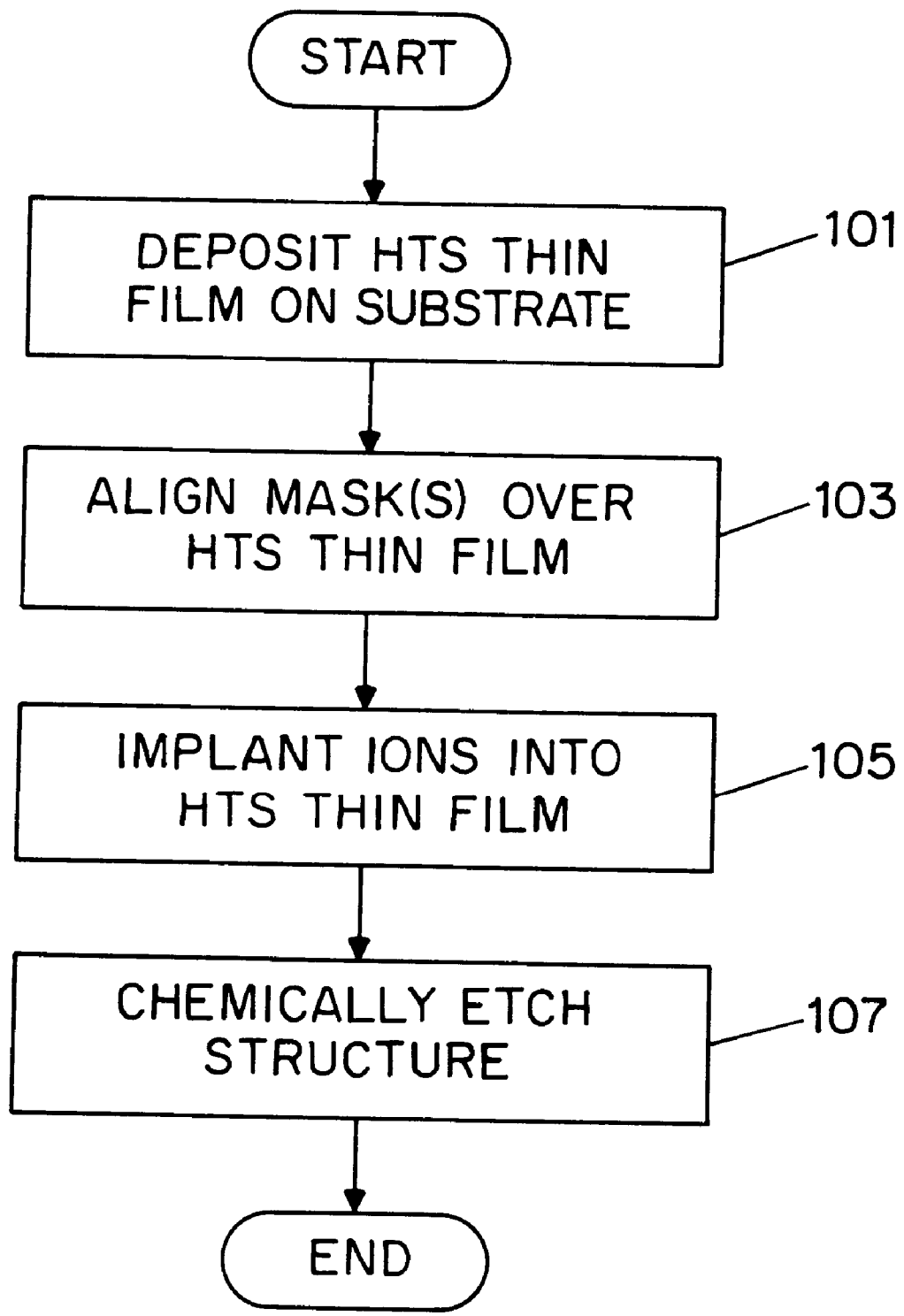
FIG. 1 is a flow chart of the steps for forming a superconducting device using a selective etching technique.

FIG. 1 shows the steps in the method for forming superconducting devices using a selective etching technique. Examples of the application of these steps will be shown in subsequent figures. The method of FIG. 1 allows for very small superconducting micro-structures, even including nano-structures, to be created without destroying or distorting the superconducting properties of the created structure.

Step 101 disposes a superconducting thin film on a substrate upon which the structure is to be created. Examples of high temperature superconducting materials which can be used in TBCCO or YBCO. The film's thickness will vary by application. In this described embodiment, the thickness is between 300 Å to 1 $\mu$m. The substrate material also varies depending upon the intended use of the structure. The results of this method is to selectively etch away portions of the HTS film and leave only the intended structure in a short period of time without damaging the desired superconducting structure.

Step 103 aligns a mask above the selected portions of the HTS films which are to remain. An example of a mask is a photoresist mask formed by normal photolithology which will inhibit ions from implanting in the underlying superconducting material during the following implantation step.

Step 105 then implants ions into the structure with an ion implanter device or other conventional method. An example of an ion implanter device which can be used is an Eaton's 3206. The ions are implanted in the direction such that the mask is first encountered before the HTS film. Different energies of ion implantation can be used. The ions can be selected from single ions such as Si, Al, B, Ni, Fe, Ca, Ti, Mn, Mg, Co, P and Sr or ion molecules (SiO2 and Si3F4). For the materials described herein, the energy level should be between 10 keV to 500 KeV and the does of $1 \times 10^{13}$ to $1 \times 10^{17}/cm^2$. The ion implantation will change the properties of the portions of the HTS film which are not covered by the mask.

Step 107 then chemically etches the entire structure. The chemical etching is preferably performed by applying an etching agent such as phosphoric acid to the structure. The application of the etching agent can be achieved by submersing the structure in an acid bath, by selectively applying the acid to the desired region or by any other conventional method. The acid will remove the portions of the HTS film which have been ion implanted much faster than the portions which have not been implanted (described in more detail below). Therefore, after a specified amount of time in contact with the dissolving agent, the structure can be removed from the etching agent leaving only that portion of the structure which was masked by the ion implantation. This allows for the creation of HTS devices in the desired pattern for a selected application. Phosphoric acid can have a concentration of $1.5 \times 10^{-3}$ M to only etch out the implanted regions. After the acid bath, the etched superconducting device may be annealed with a furnace or a rapid thermal annealer at 450C for a short period of time (30 seconds to 30 minutes) to strengthen the resulting device.

Figure 2:
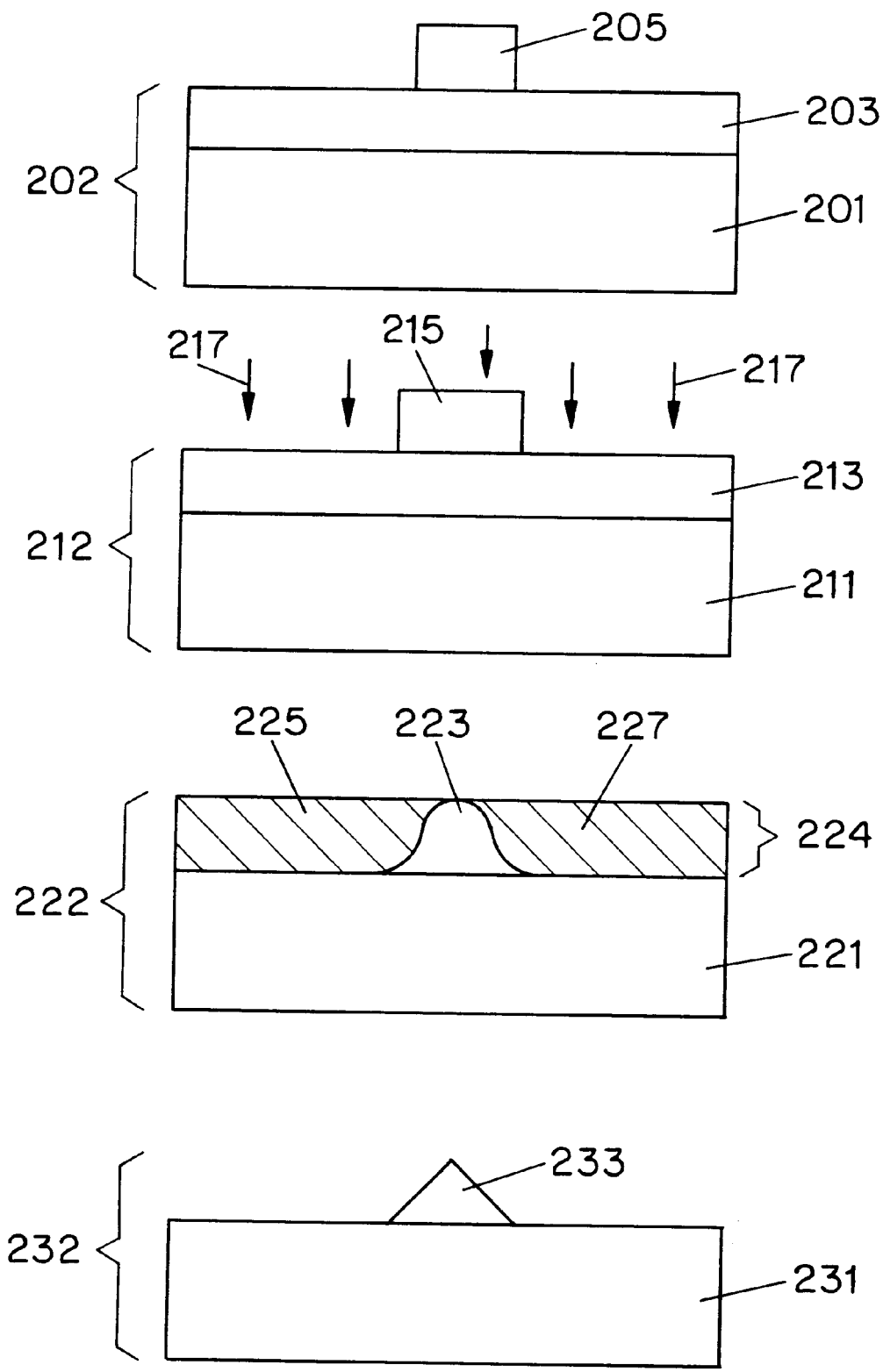
FIG. 2 shows a single layer superconducting device being constructed in accordance with the invention.

FIG. 2 shows an example of the method of FIG. 1 being applied to form a selected HTS device. The structure (device) is shown in its four phases of manufacture.

Structure 202 shows a substrate 201 upon which a HTS thin film 203 has been deposited. A mask 205 is also aligned over the HTS thin film to ensure that the portion under the mask will not be ion implanted during the implantation stage. The mask 205 in this example is an electron-beam lithographic mask with a width of 0.1 $\mu$m. The mask could be configured in any manner and multiple masks could be used on the same HTS film if needed.

Structure 212 shows the structure during the ion implantation step. The HTS film 213 is ion bombarded with ion beams 217. The mask 215 blocks the ion beam from entering the HTS thin film directly below it. The ion beams 217 may enter the substrate 211 depending on the HTS film's thickness but have no consequential effect on the substrate.

Structure 222 shows the structure after the ion implantation operation is completed. The mask has now been removed leaving only the substrate 221 and the HTS film 224. Portions 225, 227 of the HTS film 224 which were not covered by the mask have been ion implanted. The portion 223 of the HTS film 224 which was covered by the mask is not ion implanted. The portion 223 will typically have a bell shape due to transverse straggling of the ion beam with respect to the masked portions. For this example, the tails of the bell shape will typically be about 100 Å wide for a 0.1 $\mu$m mask.

Structure 232 shows the structure after its has been selectively chemically etched. The structure has been submitted to a chemical etching solution and the portions of the HTS film with ion implantation have been removed. If the structure is left in the etching solution for a few more seconds after the ion implanted portions are removed, the non-ion implanted portions will also begin to be etched away at a slower rate if the etching solution concentration is high enough. Thus the bell shaped region 223 will be modified to now have a roughly triangular shape 233 with a sharp tip having a dimension less than 100 Å or a few atomic units in distance. The only remaining portions of the structure will be the substrate 231 and the HTS device 233. The structure 232 can now be used for individual applications or combined with other structures depending upon the design specifications.

Figure 3:
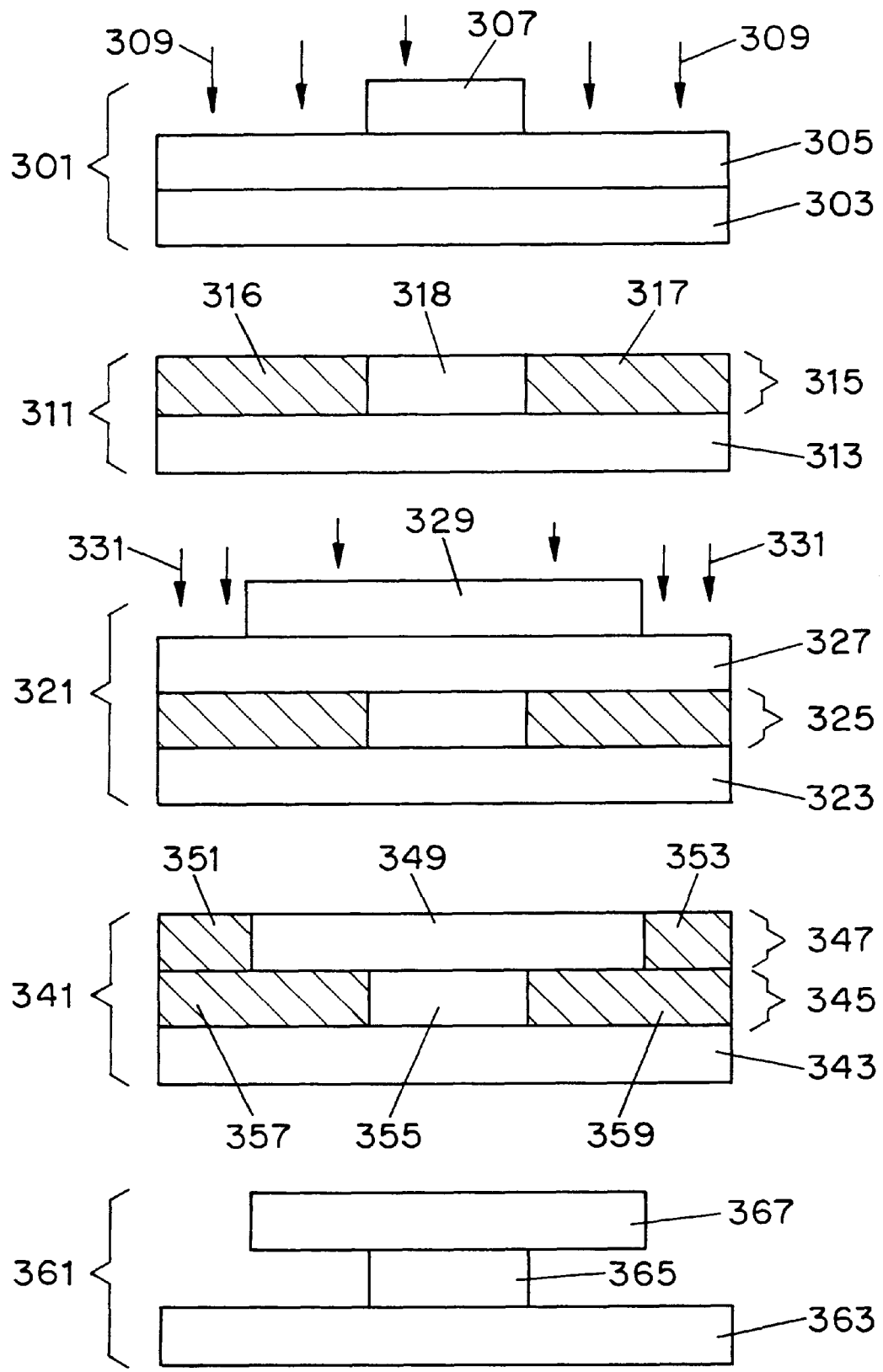
FIG. 3 shows a multi-layered superconducting device being constructed in accordance with the invention.

FIG. 3 shows an example of the method of FIG. 1 being used to form a multi-layered structure which allows for a greater range of shapes which can be used as a HTS device.

Structure 301 includes a substrate 303 upon which a HTS thin film 305 has been deposited. A mask 307 covers a portion of the HTS film which is desired to be retained in a similar manner as shown in FIG. 2. Ion beams 309 are applied to the structure 301 to implant the unprotected portions.

Structure 311 shows the results of the ion implantation. The substrate 313 now supports HTS film portion 318 which has not been ion implanted and HTS film portions 316, 317 which have been ion implanted. The mask has also been removed.

Structure 321 shows a new HTS thin film 327 being deposited upon the substrate 323 and HTS layer 325. This step is performed prior to the selective etching process. A new mask 329 is applied to cover the portion of the second layer 327 which is to remain in the resulting device. The second mask 329 must cover the entirety of the portion of the first HTS film which is to remain in the device so that the second ion implantation step will not implant the first portion. Ion beams 331 are then applied to the structure 321.

Structure 341 shows the results of the second ion implantation before any chemical etching is performed. The first HTS thin film layer 345 is deposited on substrate 343 and the second HTS thin film layer 347 is deposited on the first thin film layer. Portion 355 in the first thin film layer and portion 349 in the second thin film layer have not been ion implanted because of the placement of the respective masks. Portion 357, 359 of the first HTS thin film layer and portions 351, 353 of the second HTS thin film layer have been ion implanted in the process previously described.

Structure 361 shows the remaining structure after structure 341 has been chemically etched. The portions of the HTS thin films which has been ion implanted are etched at a much faster rate so that they are removed to leave the portions which were not ion implanted. The non-ion implanted (pure) regions will not be etched at all or, depending on the acid concentration, will be etched at a relatively slow rate so that there will be no significant deterioration in the resulting device. This layering method can be repeated as need in order to form a desired device configuration.

One such device configuration is a multiple RF coil device for receiving multiple resonance frequencies. The RF coils are configured on each superconducting layer with the use of masks. In FIG. 3, layer 365 has one or more RF coils and layer 367 has one or more RF coils. This allows the device 361 to detect and receive multiple frequencies within the single device.

Figure 4A:
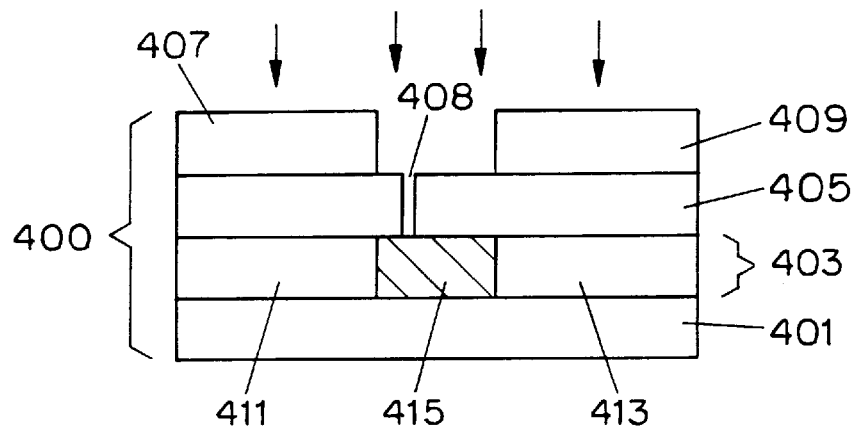
FIG. 4A shows a superconducting device constructed in accordance with the invention with a protection layer.
Figure 4A:
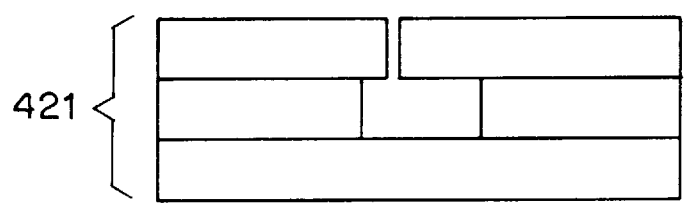
Figure 4B:
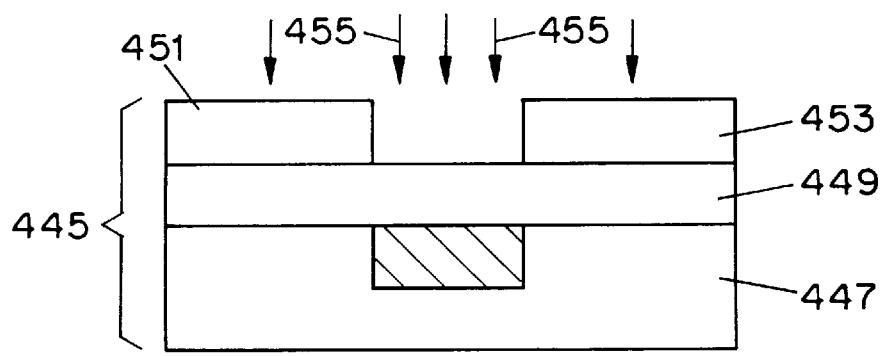
FIG. 4B shows an alternative superconducting device with a protection layer.
Figure 4B:
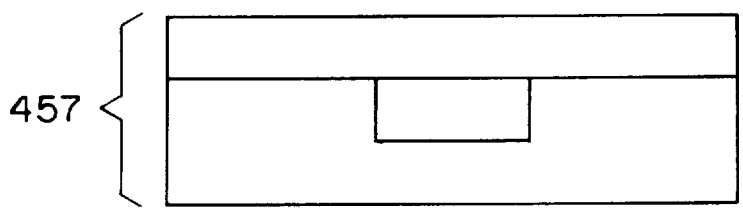
Figure 4C:
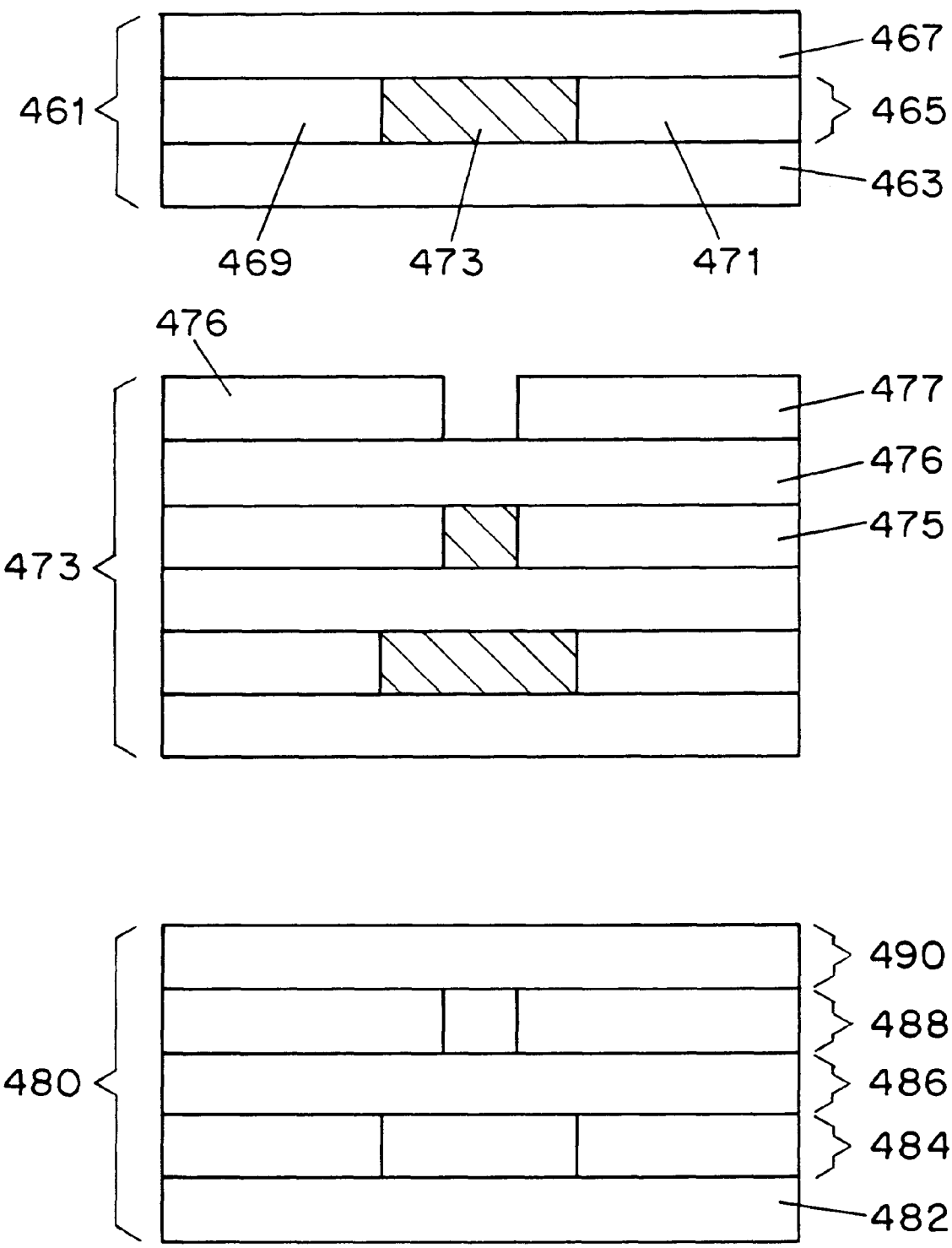
FIG. 4C shows a multi-layered superconducting device with a protection layer.

FIGS. 4A, 4B and 4C show superconducting devices which can be created with the techniques of the present invention and the addition of a cap or protecting layer. The protection layer is deposited on top of the superconducting layer when it is formed so that the superconducting layer will not react with other chemical constituents which it comes in contact with after leaving a "clean" environment, such as a clean room.

Many HTS materials are oxide materials which make them very reactive. Examples of materials which can be used as protecting layers are $SrTiO_3$, $CeO_2$, Au, Ag, MgO or $LaAlO_3$. A preferred thickness for their protecting layer is 50–1000 Å on a thin film which is 0.1–1 μm thick.

FIG. 4A shows a structure 400 with a single layer HTS thin film 403 deposited on a substrate 401 covered by a protection layer 405. The protection layer 405 is thin enough so that it does not materially diminish the ion beam in the ion implantation process. Two masks 407, 409 are placed on the edges of the HTS thin film to protect the underlying portions 411, 413 from the ion beam. The center portion 415 which is not protected by a mask is ion implanted by the ion beams. A small opening 408 is made or formed in protection layer 405 so that the chemical etching solution can work on the center of the HTS film layer 403 during the etching process.

After the structure 400 is chemically etched, superconducting device 421 remains. The center portion 423 of the device has been removed. The resulting structure can be used as a wave guide device, for example.

FIG. 4B shows a structure that is constructed in a similar manner to that described in FIG. 4A except the bottom substrate layer is replaced with a thicker superconducting material, superconducting film or a superconductor bulk wafer. Structure 445 contains a HTS base 447 and a protection layer 449 deposited on it. Two masks 451 and 453 are placed over the protection layer so that the portions of the HTS material under the masks will not be ion implanted. Ion beams 455 are then directed at structure 445 so that the center of the HTS material will be implanted with ions.

When an ion beam is directed at structure 445, the ion beam loses potency after penetrating a HTS material for a certain distance. In this example, the superconducting material will remain below the implanted range, 0.1 to 1 μm in depth from the film surface. The ion beam when applied to the thicker HTS film will only penetrate partially into the material. Thus in this example, the portions not covered by masks will only be penetrated in their top portions. Therefore, after chemically etching the structure, only the center portion of the HTS portion will be removed. The protective cap will be affixed to the top of the structure as in FIG. 4A. This new structure after chemical etching will appear as structure 457 which can act as a wave guide like structure 421 in FIG. 4A but will have different characteristics because of the additional superconducting materials in place of the substrate.

FIG. 4C shows an example of multi-layering HTS films with protection layers which allows for further patterns and designs of superconducting devices to be created.

Structure 461 shows the structure in FIG. 4A after ion implantation but before the chemical etching process is performed. HTS thin film 465 has been deposited upon substrate 463 and protection layer 467 has been deposited upon HTS thin film layer 465. Center portion 473 has been ion implanted but portions 469 and 471 have not been implanted because of the placement of the masks during the ion implantation process.

Structure 473 now shows an additional HTS thin film 475 being deposited on top of the protection layer 467. A second protection layer 476 is deposited on top of the additional HTS film 475. The HTS thin film can then be masked such that only selected portions of the second layer will remain after the chemical etching process. A second ion implantation step will then ion implant the regions of the second layer which are not covered by masks. The mask configuration must be placed such that the first HTS thin film layer will not be affected by the second ion implantation. This can be accomplished by making the first protection layer thicker or by inserting a relative thick buffer layer between the first protection layer and the second HTS layer 475. The buffer layer may use the same material as the protection layer. Masks 476 and 477 are shown in this example.

Structure 480 shows structure 473 after it has been masked, ion implanted and chemically etched. The chemical etching process has removed the ion implanted HTS thin film portions. The resulting structure can by used as waveguides or as RF coils in microwave devices. The resulting structure comprises a substrate 482 upon which selected portions 484 of a HTS film remain. A protective layer 486 is on top of the first selected portions 484 and the second selected portion 488 of the second HTS thin film is on top of the protective layer. Finally, a second protection layer 490 is on top of the second selected portion 488. The layering effect can be continued as needed.

FIG. 5 shows a table containing the etching rates of HTS materials in different concentrations of phosphoric acid. The results confirm that the process of the present invention can quickly yield superconducting devices. Column 501 shows the concentration of phosphoric acid used in the chemical etching phase of construction. Category 503 shows the etching rate of YBCO, a superconducting material, under different conditions. These conditions are: (1) when there in no ion implantation (column 505); (2) when it has been implanted with 200 KeV of $Al^{3+}$ (column 507); (30) when it has been implanted with 120 KeV of $Al^{3+}$; and (4) when it has been implanted with 100 KeV of $Fe^{3+}$. The data shows that the etching rate for the implanted superconducting films is greater than that for the pure non-ion implanted HTS films. This is especially true for lower concentrations of acid where the difference in rates is great. By selecting the proper ion to implant and the proper energy level for the ion, the etching rate can be selected as required for any manufacturing process. The etching rate in an implanted material is about 2–5 times higher than that in a pure film when using the proper ion energy and the proper acid concentration.

Category 513 shows the etching rates for a different type of HTS material, TBCCO. Column 515 shows the pure non-ion implanted HTS material and column 517 shows the ion implanted material. Again, the etching rate for the implanted mater is drastically higher. The etching rate for YBCO is about 4–10 times higher than that of TBCCO for etching solution above $1 \times 10^{-1}$ M. The improved etching rate from the present invention can help prevent degradation at the surface of HTS materials and lead to a better way of patterning.

Using phosphoric acid with concentration higher than $5 \times 10^{-2}$ M, the etching rate in an ion implanted film is much faster than that in a pure film. Below the threshold concentration of $1.5 \times 10^{-3}$ M, the acid has no etching affect on a pure film while it still etches an implanted film. This allows for more precise construction of semiconductor miniature devices because the non-implanted regions will remain fully in tact. The etching rate of the $Al^{3+}$ implanted film at an energy 200 KeV is faster than that of the $Al^{3+}$ implanted film at an energy 120 KeV. Additionally, the etching rate of $Al^{3+}$ implanted film is faster than $Fe^{3+}$ implanted film. A selective etching process can be developed for HTS film using a proper etchant in combination with ion implantation.

It is known that high quality single-phase YBCO and TBCCO materials have yielded unstable binding and defects on the surface and inside of the superconducting materials after ion implantation. Since the lattice is intact dilation, the binding energy is decreased, but only a small change occurs, which does not cause lattice parameters to change very much. It has been reported that epitaxial YBCO films can be grown on top of ion inhibited HTS films which is insulating produced by Si implantation. The etching procedure involves, first, the chemical reaction between phosphoric acid and alkaline earth elements, as the following reaction shows:

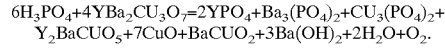

The second stage is the collapse of lattices in the crystal. The more defects and the greater the unstable binding on the surface and in the lattices, the more chances for chemical reaction, and thus a greater chemical etching rate is expected.

Figure 6:
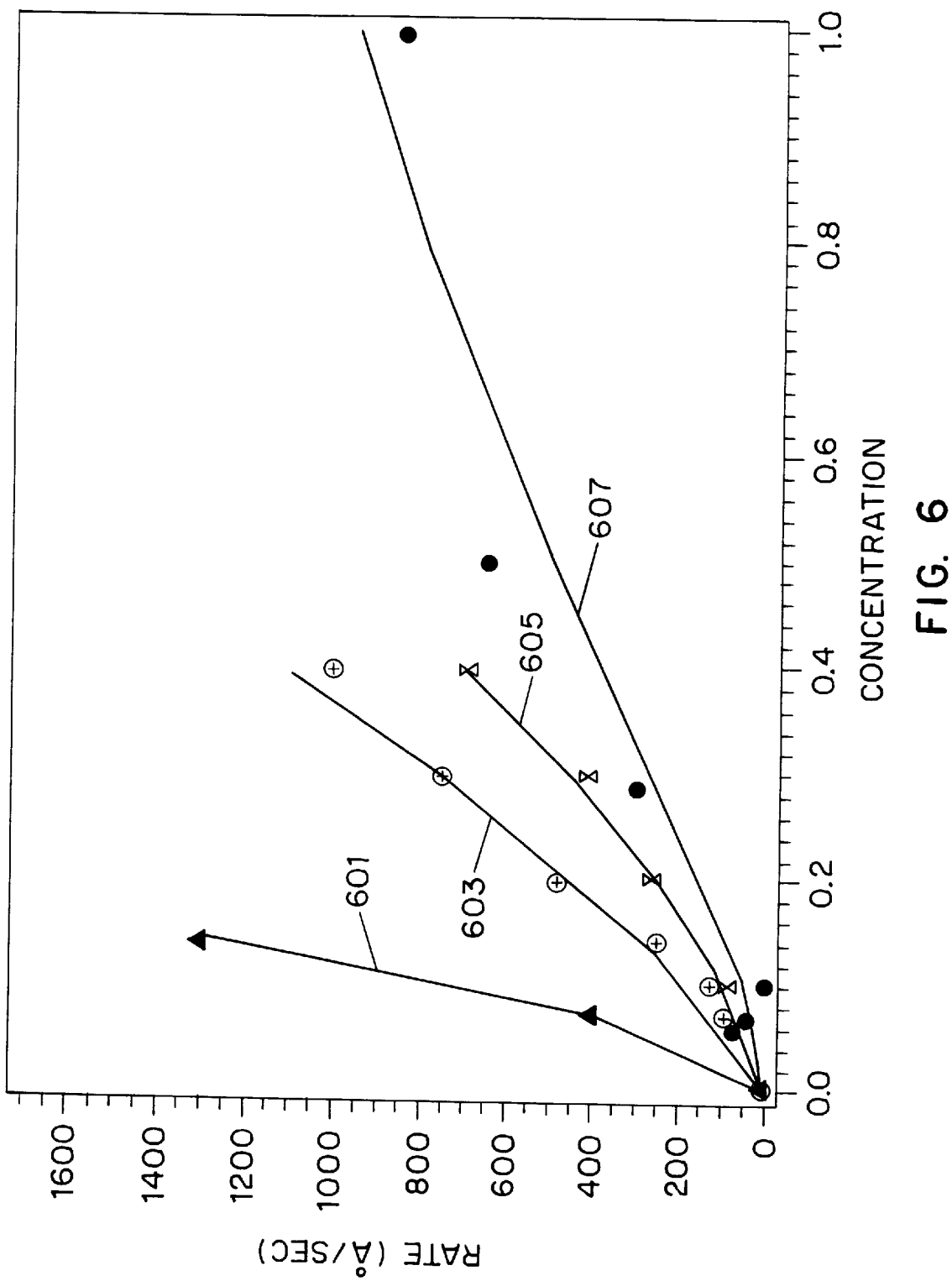
FIG. 6 shows a graph of the data from FIG. 5.

FIG. 6 shows a graph of the data points from FIG. 5. Line 607 shows the etching rate verses the etching acid concentration for pure YBCO (non-ion implanted). Line 601 shows the etching rate verses the acid concentration for Al ions at 200 KeV. Line 603 shows the etching rate verses the acid concentration for Al ions at 120 KeV. Line 605 shows the etching rate verses the acid concentration for Fe ions at 100 KeV. The graph shows visually that the HTS material implanted with ions is etched at a much greater rate than the un-implanted material so that the superconducting materials can be formed is this manner.

Figure 7A:
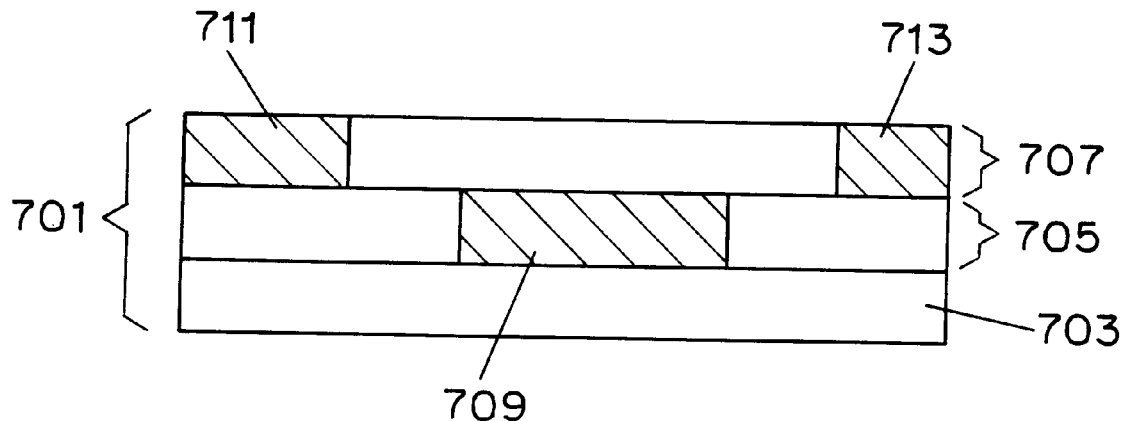
FIG. 7A shows a bolometer made in accordance with the invention prior to chemical etching.
Figure 7B:
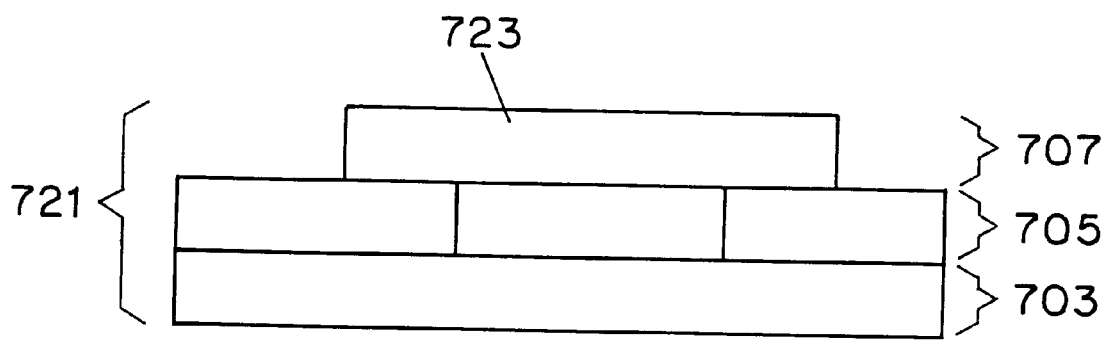
FIG. 7B shows a bolometer made in accordance with the invention after chemical etching.
Figure 7C:
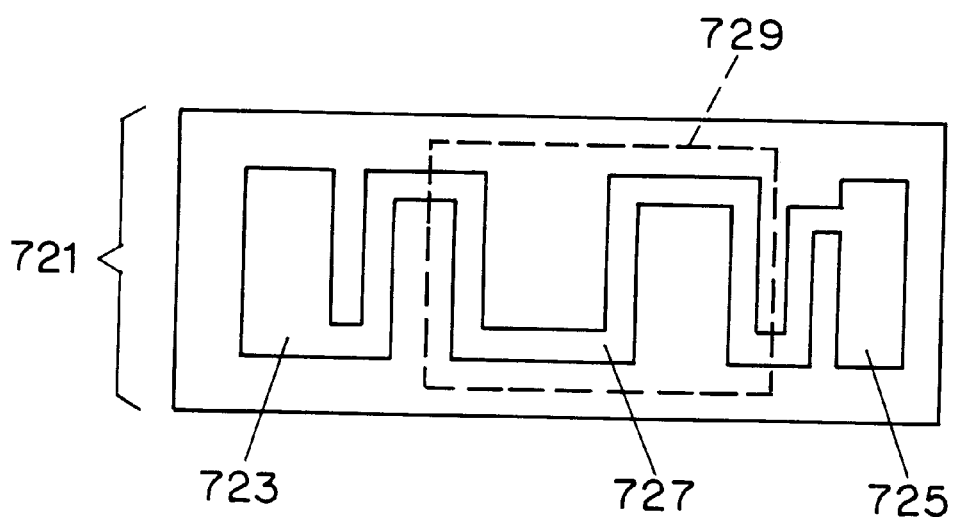
FIG. 7C shows a top view of the bolometer made in accordance with the invention.

FIGS. 7A, 7B, and 7C show a bolometer device produced by the inventive method. A bolometer can detect very small changes in temperature by changing its resistance which can then by measured and quantified. The bolometer can also detect changes in different forms of radiation. A bolometer can be more effective if the active part of the device is thermally isolated, for example, as a free standing structure.

FIG. 7A shows a bolometer 701 which has a substrate layer 703, a first superconducting thin film layer 705 and a second superconducting layer 707. Protective layers can also be inserted on top of the superconducting layers. Portions of the superconducting layers have been masked and ion implanted. The regions 709, 711 and 713 have been ion implanted.

FIG. 7B shows the bolometer of 7A after it has been chemically etched. Bolometer 723 now has a free standing top superconducting layer 723 which is positioned over an air gap. The air gap thermally isolates the active part of the bolometer from the rest of the structure.

FIG. 7C is a top view of bolometer 721. The top view shows the remaining superconducting portions 723, 725 and 727 which form the bolometer sensing circuit. The superconducting terminal portions 723, 725 are located on the superconducting first layer 705. Superconducting portion 727 is located on the second superconducting layer 707 and is elevated from the first superconducting layer 705. This multi-layered structure allows for thermal isolation of the sensing portion of the bolometer.

The foregoing merely illustrates the principles of the invention. It will thus be appreciated that those skilled in the art will be able to devise numerous systems, apparatus and methods which, although not explicitly shown or described herein, embody the principles of the invention and are thus within the spirit and scope of the invention as defined by its claims.

We claim:

1. A method for forming a superconducting device comprising the steps of:

disposing an oxide superconducting thin film layer on a substrate material;

covering selected portions of said superconducting layer with at least one mask;

implanting ions into said superconducting layer, wherein said at least one mask inhibits ion implantation in said selected portions; and chemically etching said superconducting layer with acid to remove portions of said superconducting layer which are not said selected portions, wherein said acid comprises phosphoric acid having a concentration less than $1.5 \times 10^{-3}$ M.

2. The method of claim 1, where said ion implantation step implants aluminum ions.

3. The method of claim 1, where said ion implantation step comprises using an ion implanting device with an ion beam intensity between 100 KeV and 200 KeV.

4. The method of claim 1, further including the step of forming a protection layer on said superconducting layer prior to said ion implanting step.

5. The method of claim 4, wherein said protection layer forms an opening and said chemical etching step includes applying a solvent to said superconducting layer through said formed opening.

6. The method of claim 1, wherein said superconducting device is a microstructure device.

7. The method of claim 1, wherein said superconducting device is a nanostructure device.

8. The method of claim 1, further including depositing at least one additional oxide superconducting thin film layer on said superconducting layer disposed on said substrate.

9. The method of claim 8, wherein each said at least one additional layers is covered by a mask before said ion implantation step.

10. The method of claim 8, wherein said ion implantation of said at least one additional layers are performed prior to said chemical etching step.

11. The method of claim 1, where said superconducting device is a wave guide.

12. The method of claim 1, where said superconducting device comprises a radio frequency coil.

13. The method of claim 1, where said superconducting device is a bolometer.

* * * * *

UNITED STATES PATENT AND TRADEMARK OFFICE
CERTIFICATE OF CORRECTION

PATENT NO. : 5,952,269

DATED : September 14, 1999

INVENTOR(S) : Qiyuan Ma et al.

It is certified that error appears in the above-identified patent and that said Letters Patent is hereby corrected as shown below:

Front page of patent, Item [56] References Cited, Other Publications, under Withers et al., "esonance" should read -- Resonance --. Col. 2, line 10, "19941" should read -- 1994) --. Col. 9, line 21, "a solvent" should read -- said acid --. Col. 3, line 54, "results" should read -- results --; line 62, "photolithology" should read -- photolithography --. Col. 4, line 5, "(SiO2 and Si3F4) should read -- (SiO$_2$ and Si$_3$F$_4$) --. Col. 7, line 44, "mater" should read -- material --; line 58, "in tact" should read -- intact --. Col. 8, lines 10-11, all four occurrences, "CU" should read -- Cu --; line 18, "verses" should read -- versus --; line 20, "verses" should read -- versus --; line 23, "verses" should read -- versus --; line 27, "is" should read -- in --; line 31, "by" should read -- be --. Col. 10, line 8, "each said" should read -- each of said --; line 13, "are" should read -- is --.

Signed and Sealed this

Twenty-ninth Day of May, 2001

Attest:

NICHOLAS P. GODICI

*Attesting Officer*      *Acting Director of the United States Patent and Trademark Office*